United States Patent [19]
Yoshida et al.

[11] Patent Number: 5,742,189
[45] Date of Patent: Apr. 21, 1998

[54] FREQUENCY CONVERSION CIRCUIT AND RADIO COMMUNICATION APPARATUS WITH THE SAME

[75] Inventors: Hiroshi Yoshida, Yokohama; Miyuki Ogura, Kawasaki; Koji Iino, Tokyo; Shoji Otaka, Yokohama, all of Japan

[73] Assignee: Kabushiki Kaisha Toshiba, Kawasaki, Japan

[21] Appl. No.: 528,008

[22] Filed: Sep. 14, 1995

[30] Foreign Application Priority Data

Sep. 16, 1994 [JP] Japan .................................. 6-221228

[51] Int. Cl.$^6$ ..................................................... H02M 5/00
[52] U.S. Cl. ............................. 327/113; 363/85; 455/20; 455/190.1; 455/313
[58] Field of Search ......................... 327/105, 113; 375/340, 238, 240, 241, 242; 363/39, 40, 157; 324/85; 455/190.1, 118, 130, 131, 313, 20, 323

[56] References Cited

U.S. PATENT DOCUMENTS

| | | |
|---|---|---|
| 4,061,980 | 12/1977 | Sato . |
| 4,360,791 | 11/1982 | Norris et al. . |
| 4,684,925 | 8/1987 | Maruta . |
| 4,700,151 | 10/1987 | Nagata .......................... 332/18 |
| 4,855,894 | 8/1989 | Asahi et al. . |
| 4,990,911 | 2/1991 | Fujita et al. . |
| 5,048,060 | 9/1991 | Arai et al. . |
| 5,101,416 | 3/1992 | Fenton et al. . |
| 5,461,645 | 10/1995 | Ishii ............................... 375/344 |
| 5,481,568 | 1/1996 | Yada et al. ..................... 375/340 |
| 5,495,499 | 2/1996 | Fenton et al. ................. 375/205 |

*Primary Examiner*—Wellington Chin
*Assistant Examiner*—Jean B. Corrielus
*Attorney, Agent, or Firm*—Oblon, Spivak, McClelland, Maier & Neustadt, P.C.

[57] ABSTRACT

A frequency conversion apparatus comprising a sampling circuit for receiving a first intermediate frequency signal extracted from an input signal and having a predetermined intermediate frequency and a predetermined band width and sampling the first intermediate frequency signal in accordance with a predetermined sampling frequency signal, to output a second intermediate frequency signal, and a sampling signal generator for outputting the sampling frequency signal to the sampling circuit, the sampling frequency signal having a frequency determined so that an integer multiple of not less than three times the sampling frequency is outside a frequency range of the input signal.

19 Claims, 10 Drawing Sheets

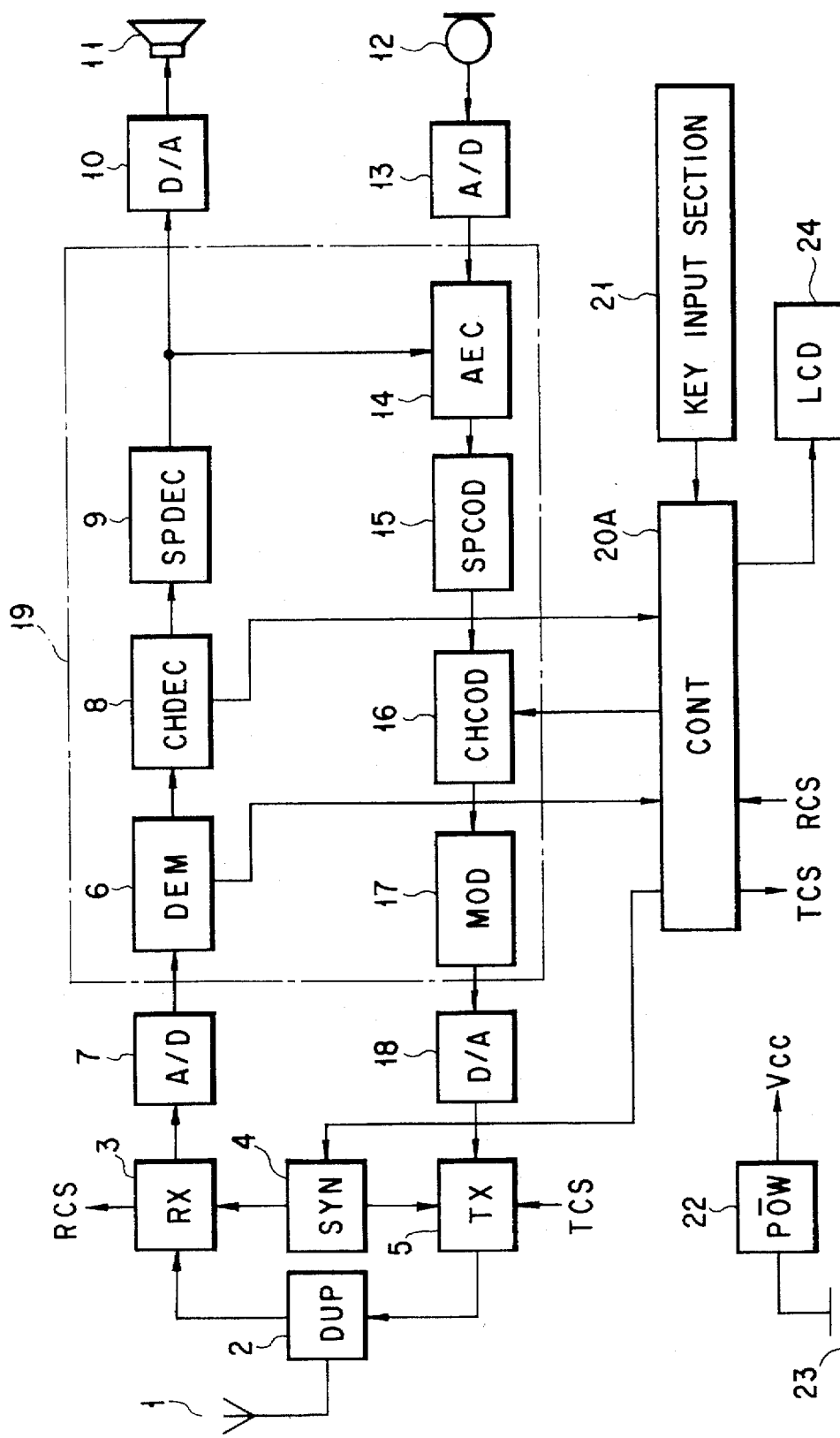
F I G. 5

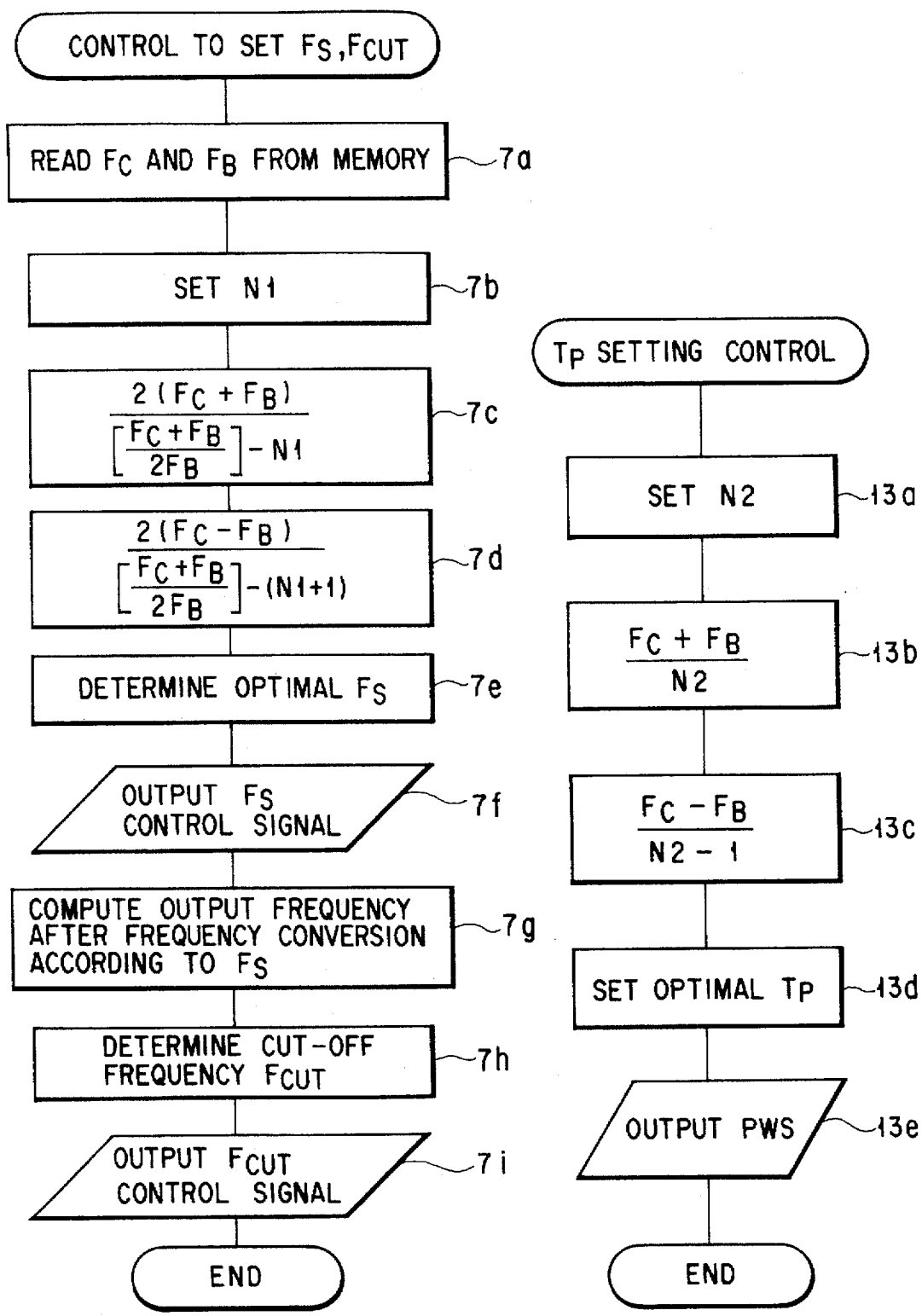
F I G. 11    F I G. 17

FREQUENCY CONVERSION CIRCUIT AND RADIO COMMUNICATION APPARATUS WITH THE SAME

BACKGROUND OF THE INVENTION

1. Field of the Invention

The present invention relates to a frequency conversion circuit which is provided in, for example, a radio communication apparatus to frequency-convert a received radio frequency signal to an intermediate frequency signal or a baseband signal, and, more particularly, to a circuit which executes frequency-conversion by sampling a radio frequency signal.

2. Description of the Related Art

A conventional frequency conversion circuit of this type comprises a sampling circuit and a square wave generator for supplying a sampling signal as a local oscillation signal to this sampling circuit. The square wave generator generates a square wave signal of a frequency lower than that of an input radio frequency signal. The sampling circuit samples the input signal in accordance with the square-wave sampling signal to frequency-convert the input signal to an intermediate frequency signal.

The principle of this frequency-conversion will now be described. Let us denote the waveform of the band-limited input signal in a time domain as r(t) and the spectrum of the input signal in the associated frequency domain as R(f). This spectrum R(f) is obtained by Fourier transform of r(t), and has a waveform as shown in FIG. 1. Given that the cycle of a square wave (pulse width: Ts/2) equivalent to a local oscillation signal l(t) is denoted by $T_S$ as shown in FIG. 2, the spectrum L(f) of this spectrum takes the form of an impulse train with an interval $T_S$ (=1/$F_S$) multiplied by $\sin(\pi f T_S/2)/(\pi f T_S/2)$ as shown in FIG. 3.

The sampling of the input signal r(t) with this square wave l(t) is equivalent to the convolution of the spectrum R(f) of the input signal and the spectrum L(f) of the square wave in the frequency domain. The sampling of the input signal r(t) with this square wave l(t) therefore yields a predetermined frequency signal as shown in FIG. 4. The center frequency Fi of this frequency signal is the difference between the center frequency $F_C$ of the input signal and the inverse number $F_S$ of the cycle $T_S$ of the square wave ($F_C - F_S$).

Depending on the value of the sampling frequency $F_S$, however, the frequency conversion circuit using such a sampling system sometimes frequency-converts a plurality of input signals with different frequencies to have the same frequency band. That is, in the same frequency band after frequency-conversion, signals in a plurality of frequency bands before conversion are superimposed on one another. When this superimposition occurs, a demodulator at the subsequent stage cannot reproduce any of those input signals, resulting in disabling communication.

The frequency-converted intermediate frequency signal is input to a digital signal processor (DSP) after being converted to a digital signal by, for example, an A/D converter, and undergoes digital demodulating or decoding in the processor. In consideration of this digital signal processing, it is desirable that the frequency of the frequency-converted intermediate frequency signal be as low as possible.

When the input signal is sampled with a square-wave sampling signal as mentioned above, however, the signal level of the baseband of the output signal after sampling significantly decreases depending on the pulse width of the square wave, so that a low-frequency intermediate frequency signal with a sufficient signal level cannot be output.

As described above, the conventional frequency conversion circuit has such problems that signals in a plurality of frequency bands before conversion may be superimposed on one another after frequency-conversion depending on the sampling frequency, and that the amplitude of the output signal may reduce in a low frequency band after frequency-conversion depending on the pulse width of the sampling signal, making it unable to output a low-frequency intermediate frequency signal with a sufficient signal level.

SUMMARY OF THE INVENTION

Accordingly, it is a primary object of the present invention to provide a frequency conversion circuit which is able to execute the accurate frequency-conversion over the entire frequency band targeted for reception in order to prevent the superimposition of unconverted signals in a plurality of frequency bands from occurring after frequency-conversion.

It is another object of this invention to provide a frequency conversion circuit capable of suppressing the reduction of the signal level in a low frequency band to permit a low-frequency intermediate frequency signal with a sufficient signal level to be outputted.

It is a further object of this invention to provide a radio communication apparatus equipped with a frequency conversion circuit which can frequency-convert an input signal of a plurality of channels in such a manner that the signals after the frequency conversion are not superimposed on one another.

It is a still further object of this invention to provide a radio communication apparatus equipped with a frequency conversion circuit which can prevent input signals to a plurality of radio systems of different usable frequency bands from being superimposed on one another and can output a low-frequency intermediate frequency signal with a sufficient signal level.

According to the present invention, there is provided a frequency conversion apparatus which comprises a sampling circuit for receiving an input signal having a predetermined intermediate frequency and a predetermined band width and sampling the input signal in accordance with a predetermined sampling frequency signal, to output an intermediate frequency signal, and a sampling signal generator for outputting the sampling frequency signal to the sampling circuit, the sampling frequency signal having a frequency determined so that the frequency of the input signal is excluded from a frequency range of an integer multiple of the sampling frequency and a frequency range less than ½ thereof.

According to the present invention, there is provided a radio communication equipment comprising a frequency conversion apparatus which comprises a first frequency conversion circuit for receiving a reception signal sent from one of a plurality of radio equipments of different PHS frequency bands and converting the reception signal to a first intermediate frequency signal having a frequency lower than that of the reception signal, and a second frequency conversion circuit including a sampling circuit for sampling the first intermediate frequency signal in accordance with a predetermined sampling frequency signal to output a second intermediate frequency signal, and a sampling signal generator for outputting the sampling frequency signal to the sampling circuit, the sampling frequency signal having a frequency determined so that the frequency of the first intermediate frequency signal is excluded from a frequency range of an integer multiple of the sampling frequency and a frequency range less than ½ thereof, and a demodulator for demodulating the second intermediate frequency signal.

According to this invention, it is possible to perform frequency-conversion in such a way that signals with a plurality of frequencies before sampling are not superimposed on one another in the same frequency band after sampling. Signals of all the channels can accurately be frequency-converted so that they are not superimposed on one another.

Further, according to this invention, the radio communication apparatus with a frequency conversion circuit which can compute the optimal sampling frequency for frequency-conversion for each radio system to be communicated and can set the sampling frequency in the sampling signal generator. It is therefore possible to perform frequency-conversion with the optimal sampling frequency which does not cause superimposition for any of a plurality of radio systems of different usable frequency bands.

Furthermore, according to this invention, the radio communication apparatus, which has a frequency conversion circuit and uses a pulse train signal having a pulse width as a sampling signal to be used by this frequency conversion circuit, is provided with a circuit for computing the optimal sampling frequency and setting it in the sampling signal generator and a circuit for computing the optimal pulse width and setting it in the sampling signal generator, whereby frequency-conversion can be executed with a sampling pulse having the optimal sampling frequency which does not cause superimposition and having the optimal pulse width which can suppress the attenuation of the signal level, with respect to any of a plurality of radio systems of different usable frequency bands.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a circuit block diagram showing one example of the structure of a portable digital cellular phone equipped with a frequency conversion circuit according to a first embodiment of this invention;

FIG. 11 is a flowchart illustrating the control sequence for setting the sampling frequency by a controller shown in FIG. 10;

FIG. 17 is a flowchart illustrating the control sequence for setting the sampling frequency by a controller shown in FIG. 16;

DETAILED DESCRIPTION OF THE PREFERRED EMBODIMENTS

Figure 1:
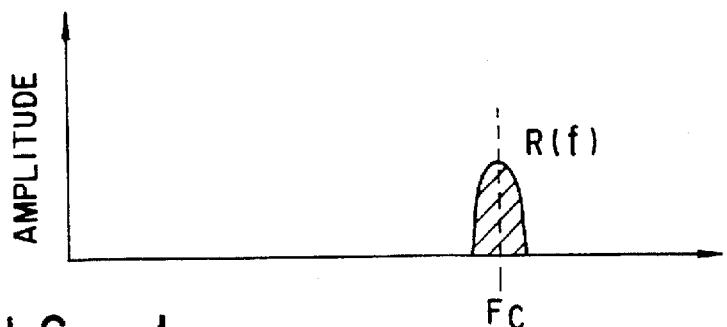
FIG. 1 is a diagram showing the frequency spectrum of an input signal before frequency-conversion.
Figure 2:
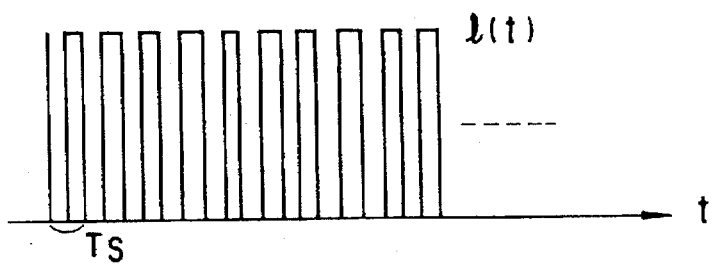
FIG. 2 is a diagram showing the waveform in a time domain of a square wave to be used as a sampling signal.
Figure 3:
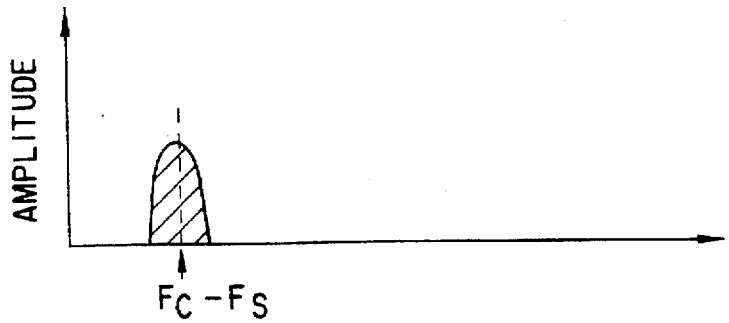
FIG. 3 is a diagram showing the frequency spectrum of the square wave shown in FIG. 2.
Figure 4:
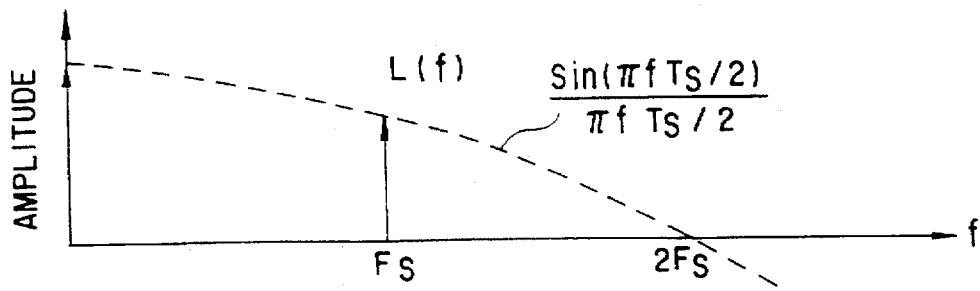
FIG. 4 is a diagram showing the frequency spectrum of an intermediate frequency signal obtained by sampling the input signal in FIG. 1 with the square wave in FIG. 2.

According to a portable digital cellular phone equipped with a frequency conversion circuit according to the first embodiment shown in FIG. 5, a radio communication signal sent via a radio communication channel from a base station (not shown) is input to a receiver circuit (RX) 3 via an antenna 1 and an antenna duplexer (DUP) 2. This receiver circuit 3 includes multiple stages of frequency conversion circuits to be described later, in which the radio communication signal is mixed with a receiver's local oscillation signal, produced by a frequency synthesizer (SYN) 4 to be converted to an intermediate frequency signal.

The received intermediate frequency signal IFS output from the receiver circuit 3 is converted by an analog-digital (A/D) converter 7 to a digital signal DRS, which is in turn input to a digital demodulator (DEM) 6. This digital demodulator 6 performs frame synchronization and bit synchronization with respect to the received signal, and then executes signal processing for digital demodulation. A digital speech signal output from the digital demodulator 6 is subjected to error correction and decoding in an error correction decoder (CH-DEC) 8. The resultant signal is decoded by a speech decoder (SP-DEC) 9, and is returned to an analog communication signal by a digital-analog (D/A)

converter 10. This analog communication signal is then supplied to a loudspeaker 11 and is output therethrough.

A speech signal input to a microphone 12 is digitized by an A/D converter 13, and an acoustic echo component is canceled by an audio echo canceler (AEC) 14. The resultant signal is then input to a speech coder (SP-COD) 15, which in turn encodes the digital speech signal by a coding system such as the VSELP system. The coded digital speech signal is subjected, together with a digital control signal from the controller 20A, to error correction and coding in an error correction coder (CH-COD) 16, and is then input to a digital modulator (MOD) 17.

The digital modulator 17 produces a modulated signal according to the coded digital speech signal. This modulated signal is converted by a D/A converter 18 to an analog signal which is in turn input to a transmit circuit (TX) 5. The transmitter circuit 5 mixes the modulated signal with the transmitter's local oscillation signal from the frequency synthesizer 4 to be converted to a radio frequency signal, and then controls transmission power in accordance with a control signal TCS from the controller 20A. The radio frequency signal output from the transmitter circuit 5 is transmitted to the base station (not shown) from the antenna 1 via the antenna duplexer 2.

In the apparatus of this embodiment, the functions of the digital demodulator 6, the digital modulator 17, the error correction decoder 8, the error correction coder 16, the speech decoder 9, the speech coder 15 and the audio echo canceler 14 among the above-depicted circuits are accomplished by the digital signal processing executed by a digital signal processor (DSP) 19.

The controller 20A has, for example, a micro-computer as the main controller and has control functions, such as the radio channel connection control and the communication control. A key input section 21 is provided with a transmission key, an end key, a dial key and various function keys. An LCD (Liquid Crystal Display) 24 is used to display the telephone number of a communication destination terminal, the operational status of the apparatus, etc. A power source (POW) 22 produces the desired operation voltage $V_{CC}$ based on the output voltage of a battery 23 and supplies the operation voltage to the individual circuits.

Figure 6:
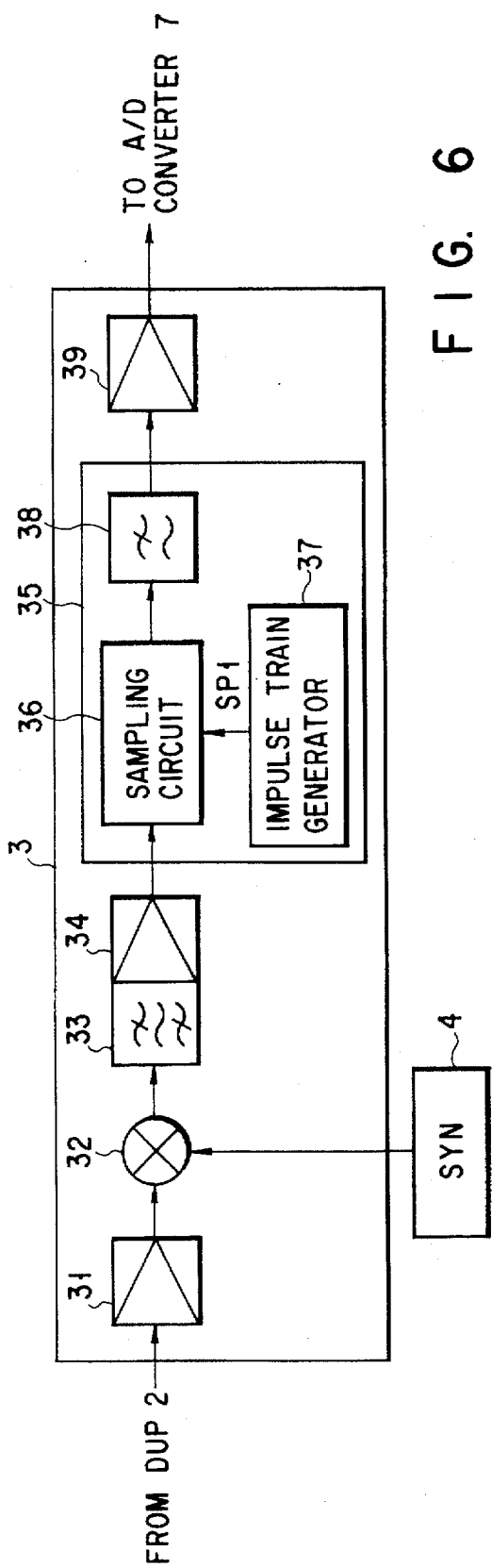
FIG. 6 is a circuit block diagram showing the structure of a receiver circuit shown in FIG. 5.

The receive circuit 3 is constituted as follows. FIG. 6 presents a circuit block diagram showing the structure of the receiver circuit 3. In the diagram, the received radio frequency signal is amplified by a low noise amplifier 31, and is then input to a first mixer 32. The mixer 32 mixes the amplified signal with the local oscillation signal output from the frequency synthesizer 4 to be converted to a first received intermediate frequency signal. This first received intermediate frequency signal is sent through a first intermediate frequency filter 33 and a first intermediate frequency amplifier 34 to a frequency conversion circuit 35 according to this invention.

The frequency conversion circuit 35 comprises a sampling circuit 36, an impulse generator 37 as a sampling signal generator and a low pass filter 38.

The impulse generator 37 generates an impulse train SP1 whose frequency is previously fixed, and supplies it to the sampling circuit 36. The sampling circuit 36 samples the first received intermediate frequency signal in accordance with the impulse train SP1 from the impulse generator 37, and sends the sampling output as a second received intermediate frequency signal. The low pass filter 38 selectively passes the lowest-frequency desired signal from among the output signal from the sampling circuit 36. The received intermediate frequency signal output from this low pass filter 38 is input via a second intermediate frequency amplifier 39 to the A/D converter 7.

The frequency $F_S$ of the impulse train SP1 in the second frequency conversion circuit 35 is set as follows based on the center frequency and band width of the first received intermediate frequency signal which is the input signal to the sampling circuit 36. Given that the center frequency of the first received intermediate frequency signal to be input to the sampling circuit 36 is denoted by $F_C$ and the band width of this intermediate frequency signal is $2 \cdot F_B$, the frequency $F_S$ of the impulse train SP1 is so set as to satisfy the following condition.

$$\frac{2(F_C + F_B)}{\left[\frac{F_C + F_B}{2F_B}\right] - N1} < F_S < \frac{2(F_C - F_B)}{\left[\frac{F_C + F_B}{2F_B}\right] - (N1 + 1)} \quad (1)$$

where $$N1 = 0, 1, 2, \ldots, \left[\frac{F_C + F_B}{2F_B}\right] - 2,$$

and [ ] indicates a gauss symbol.

The action of the thus constituted frequency conversion circuit will be described below.

Figure 7:
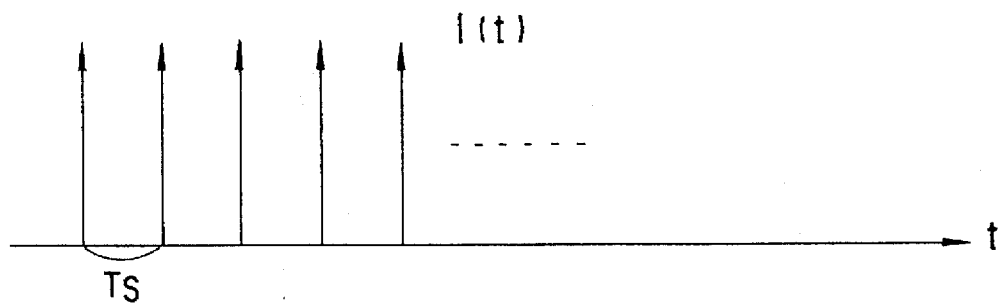
FIG. 7 is a diagram showing the waveform in a time domain of an impulse train to be used as a sampling signal.
Figure 8:
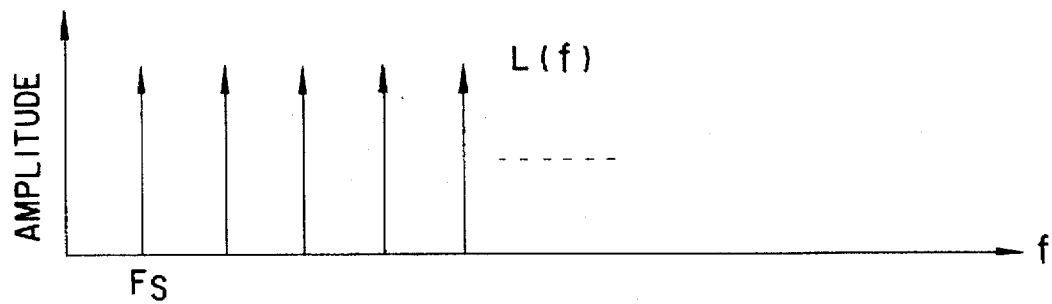
FIG. 8 is a diagram showing the frequency spectrum of an impulse train to be used as a sampling signal.

Assume that the first received intermediate frequency signal having the waveform r(t) in the time domain and the spectrum R(f) in the frequency domain has been input to the sampling circuit 36. At this time, the impulse generator 37 has generated a plurality of impulse trains SP1 whose cycle is set to $T_S$ as shown in FIG. 7 and whose spectra L(f) in the frequency domain are present at frequency intervals $F_S$ ($=1/T_S$) as shown in FIG. 8.

Figure 9:
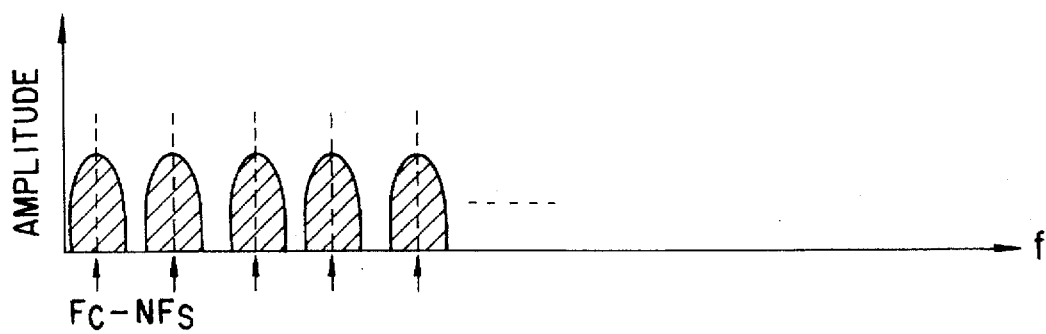
FIG. 9 is a diagram showing the frequency spectrum of an intermediate frequency signal after frequency-conversion.

The sampling of the first received intermediate frequency signal with such an impulse train SP1 is equivalent to the convolution of the frequency spectrum R(f) of the first received intermediate frequency signal and the frequency spectrum L(f) of the impulse train SP1. As shown in FIG. 9, therefore, a plurality of spectra appears from the sampling circuit 36 at intervals equivalent to $F_C - N \cdot F_S$, which is the difference between the center frequency $F_C$ of the first received intermediate frequency signal and the reciprocal of the cycle $T_S$ of the impulse train SP1 or the integer multiple of the frequency $F_S$, $N \cdot F_S$. The low pass filter 38 selects one of those spectra which has the lowest center frequency and supplies it as the second received intermediate frequency signal to the A/D converter 7.

In this embodiment, the frequency $F_S$ of the impulse train SP1 is set to an arbitrary value within the range given by the above-given equation (1). The equation (1) satisfies a condition that an integer multiple not less than three times the sampling frequency is outside a desired signal frequency band. Thus, the input signal can be frequency-converted without superimposing the desired signals on one another.

The above will be described more specifically. Suppose that the center frequency $F_C$ of the first received intermediate frequency signal is 2000 MHz and the band width $2 \cdot F_B$ thereof is 20 MHz, i.e., the input signal is a band signal of 1990 MHz to 2010 MHz. The frequency $F_S$ of the impulse train SP1 which satisfies the condition of this embodiment is expressed as follows from the equation (1).

$$\frac{4020}{100 - N1} \text{ [MHz]} < F_S < \frac{3980}{100 - (N1 + 1)} \text{ [MHz]} \quad (2)$$

If N1=19, for example, the equation (2) becomes $$\frac{4020}{100-19} \text{ [MHz]} < F_S < \frac{3980}{100-20} \text{ [MHz]} \quad (3)$$

That is, $$49.63 \text{ [MHz]} < F_S < 49.75 \text{ [MHz]} \quad (4)$$

In accordance with this condition, $F_S$=49.7MHz is selected as the sampling frequency, for example, and the oscillation frequency of the impulse generator is set to this frequency $F_S$. Accordingly, the 2010-MHz frequency component of the input signal is frequency-converted to have a frequency of 2010−(49.7×40)=22 MHz, the 2000-MHz frequency component is frequency-converted to have a frequency of 2000−(49.7×40)=12 MHz, and the 1990-MHz frequency component is frequency-converted to have a frequency of 1990−(49.7×40)=2 MHz. In other words, every band signal of 1990 MHz or above and of 2010 MHz or below is frequency-converted to a signal of 2 MHz to 22 MHz so that no signals within this range overlap one another.

if the sampling frequency $F_S$ is set to an arbitrary value that does not meet the condition of the equation (1), e.g., 49.875 MHz, the 2010-MHz frequency component of the input signal is frequency-converted to have a frequency of 2010−(49.875×40)=15 MHz and the 2000-MHz frequency component is frequency-converted to have a frequency of 2000−(49.875×40)=5 MHz. But, the 1990-MHz frequency component of the input signal is also frequency-converted to a signal of (49.875×40)−1990=5 MHz so that this frequency overlaps the signal frequency obtained by frequency-converting 2000 MHz. In other words, input signals in all the radio channels lying in the range between 1990 MHz and 2000 MHz are superimposed on one another so that every input signal belonging to the frequency band of 1990 MHz to 2000 MHz cannot be reproduced.

According to this embodiment, therefore, the frequency conversion circuit, which causes the sampling circuit 36 to sample the first received intermediate frequency signal with the impulse train SP1 generated by the impulse generator 37, is provided with the impulse generator 37 which selects an arbitrary value in the frequency range that meets the condition given in the equation (1) as the sampling frequency $F_S$ and generates the impulse train SP1 of this selected sampling frequency $F_S$ accordingly. In other words, the sampling frequency is determined so that the frequency band of the input signal excludes an integer multiple not less than three times the sampling frequency $F_S$.

This embodiment can therefore perform frequency-conversion in such a manner that a plurality of unsampled signals with different frequencies do not overlap one another in the same frequency band after sampling. The accurate frequency-conversion can be accomplished without superimposing the channel signals of all the frequencies over the entire frequency band of a single radio system targeted for radio communication.

In the above embodiment, since the second frequency conversion circuit 35 provides with the filter 38 connected to the next stage of the sampling circuit 36, the filter 38 is not always required.

There will now be described a second embodiment hereinafter.

According to the second embodiment, a portable digital cellular phone, which has a sampling type frequency conversion circuit, is provided with means for computing the optimal sampling frequency for frequency-conversion and variably setting the sampling frequency in a sampling signal generator, whereby frequency-conversion is executed with the optimal sampling frequency that does not cause superimposition for any of a plurality of radio systems of different usable frequency bands.

Figure 10:
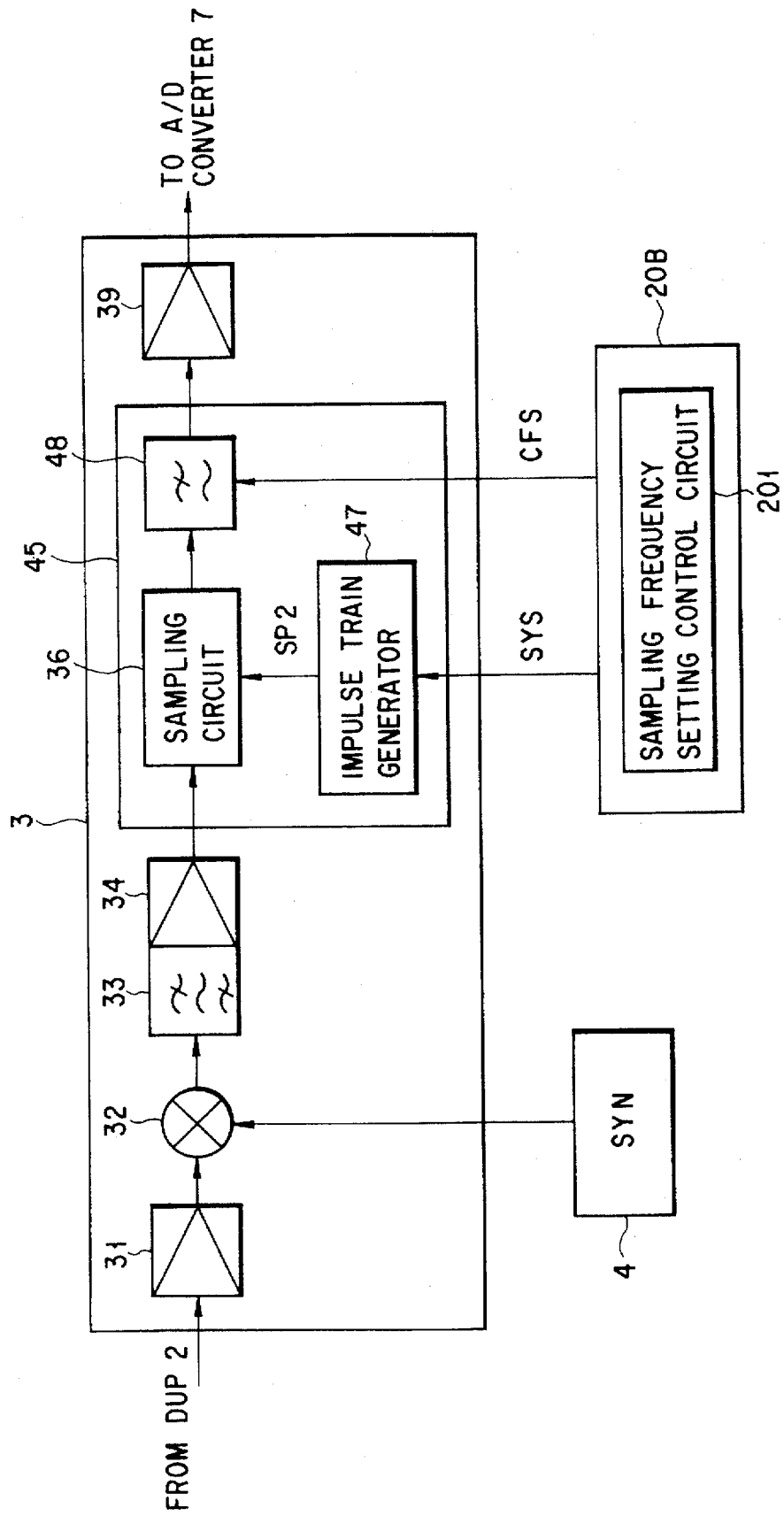
FIG. 10 is a circuit block diagram showing the structures of the essential portions of a portable digital cellular phone equipped with a frequency conversion circuit according to a second embodiment of this invention.

FIG. 10 presents a circuit block diagram showing the structures of the essential portions of a portable digital cellular phone equipped with a frequency conversion circuit according to this embodiment. Like or same reference numerals as used in FIG. 6 are also used in FIG. 10 to denote corresponding or identical components and their detailed descriptions will not be given.

The frequency conversion circuit 45 of this embodiment comprises a sampling circuit 36, an impulse generator 47, and a low pass filter 48 constituted of an active filter whose cut-off frequency can be variably set externally. The impulse generator 47 is constituted of a frequency synthesizer whose oscillation frequency can be variably set externally as discussed earlier. This impulse generator 47 generates an impulse train SP2 of a frequency corresponding to the oscillation frequency control signal SYS supplied from a controller 20B. The low pass filter 48 can variably set the cut-off frequency $F_{cut}$ in accordance with a cut-off frequency control signal CFS supplied from the controller 20B.

The controller 20B has a sampling frequency setting control circuit 201 in addition to the ordinary control functions like the radio channel connection control and communications control. When the radio system at the communication destination is switched to another one, this control circuit 201 computes the optimal sampling frequency $F_S$ in accordance with the equation (1) based on the center frequency $F_C$ and band width $F_B$ of the frequency band the switched new radio system uses. The frequency setting control signal (division frequency designating signal) SYS that designates the computed optimal sampling frequency $F_S$ is supplied to the impulse generator 47 in the frequency conversion circuit 45. In addition, the optimal cut-off frequency $F_{cut}$ is determined on the basis of the optimal sampling frequency $F_S$, and the cut-off frequency control signal CFS is supplied to the low pass filter 48.

With the above structure, when an instruction to switch the first digital radio system which a communication service provider uses to the second digital radio system of a different usable frequency band which another carrier uses, the controller 20B computes the optimal sampling frequency $F_{S2}$ and cut-off frequency $F_{cut2}$ in accordance with the sequence illustrated in FIG. 11.

First, the center frequency $F_{c2}$ and frequency band $F_{B2}$ of the switched second digital radio system are read from a memory in the controller 20B in step 7a, and then an arbitrary value for N1 is determined in step 7b. Next, the left-hand side of the equation (1)

$$\frac{2(F_C + F_B)}{\left[\frac{F_C + F_B}{2F_B}\right] - N1} \quad (5)$$

is computed in step 7c, and the right-hand side of the equation (1)

$$\frac{2(F_C - F_B)}{\left[\frac{F_C + F_B}{2F_B}\right] - (N1 + 1)} \quad (6)$$

is computed in step 7d. In step 7e, a proper value is selected from the range expressed by those values, and it is set as the sampling frequency $F_{s2}$. Then, the division frequency corresponding to the sampling frequency $F_{s2}$ is set in the impulse generator 47 in step 7f.

The controller 20B computes the frequency after frequency-conversion which corresponds to the sampling frequency $F_{s2}$ in step 7g, and determines the cut-off frequency $F_{cut2}$ of the low pass filter 48 in accordance with the computed frequency in step 7h. In step 7i, the designation control signal CFS of the determined cut-off frequency $F_{cut2}$.

As a result, the impulse generator 47 generates the impulse train SP2 of the designated sampling frequency $F_{s2}$ thereafter. When communications start in this situation, therefore, the sampling circuit 36 samples the first received intermediate frequency signal with the impulse train SP2 of the frequency $F_{s2}$. At this time, the frequency $F_{s2}$ of the impulse train SP2 is the signal obtained by performing frequency-conversion in the controller 20B in such a way that a plurality of signals with different frequencies before frequency-conversion should not be frequency-converted to have the same frequency. Even when radio communications are to be performed with the second digital radio system, the accurate frequency-conversion can be executed over the entire usable frequency band without causing the superimposition of a plurality of channel signals.

Because the cut-off frequency $F_{cut}$ of the low pass filter 48 is set back to the optimal value, it is possible to accurately extract the spectrum with the lowest frequency from a plurality of spectra appearing on the output of the sampling circuit 36, thereby allowing the received intermediate frequency signal of as low a frequency as possible to be supplied to the digital signal processor at the subsequent stage.

In the second embodiment, since the second frequency conversion circuit 45 provides with the filter 48 connected to the rear stage of the sampling circuit 36, the filter 48 is not always required.

There will now be described a third embodiment hereinafter.

In the third embodiment, when a pulse signal having a pulse width is used as a sampling signal, the attenuation of a frequency-converted signal in a low frequency range after frequency-conversion is suppressed by setting the value of the pulse width to the value that satisfies a predetermined condition, thereby obtaining as low an intermediate frequency as possible by the frequency-conversion by the sampling.

Figure 12:
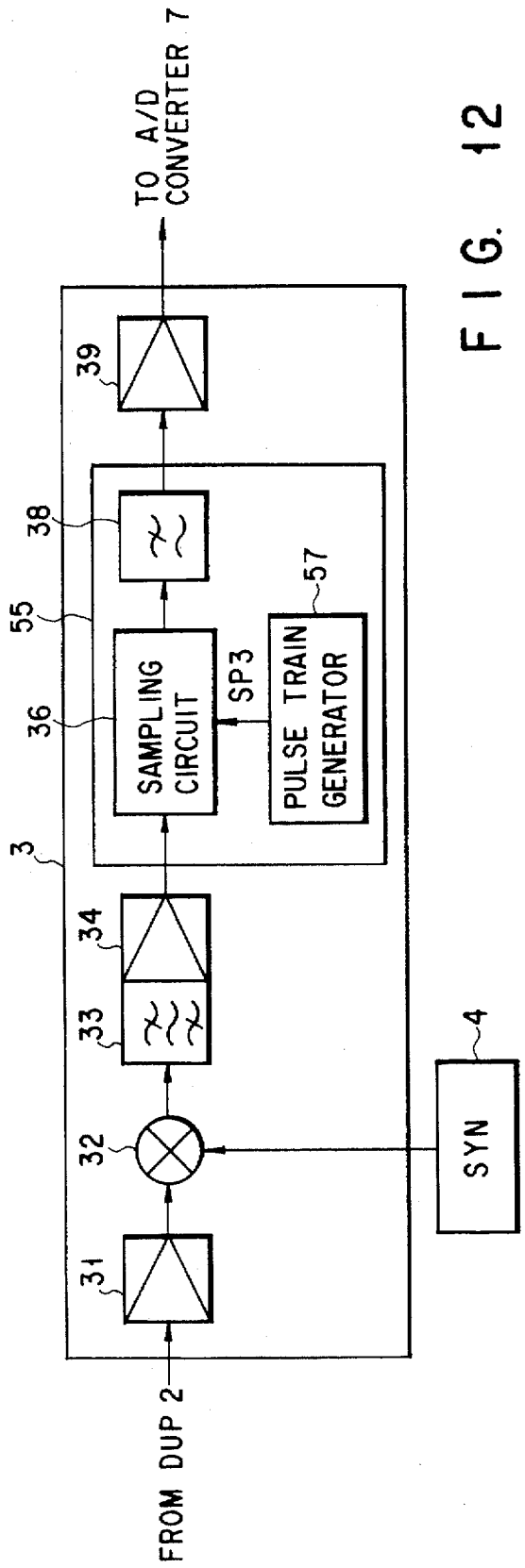
FIG. 12 is a circuit block diagram showing the structure of a frequency conversion circuit according to a third embodiment of this invention.

FIG. 12 is a circuit block diagram showing the structure of a frequency conversion circuit according to this embodiment. Like or same reference numerals as used in FIG. 6 are also used in FIG. 12 to denote corresponding or identical components and their detailed descriptions will not be given.

The frequency conversion circuit 55 of this embodiment has a pulse train generator 57. This pulse train generator 57, like the impulse generator 37 discussed in the section of the first embodiment, is so designed as to generate a pulse train SP3 having a pulse width $T_P$ whose inverse number $F_P$ is set to an arbitrary value within a range indicated by $$\frac{F_C+F_B}{N2} < F_P < \frac{F_C-F_B}{N2-1} \quad (7)$$

where N2=2, 3, 4, . . .

The action of the frequency conversion circuit according to this embodiment will now be described.

Figure 13:
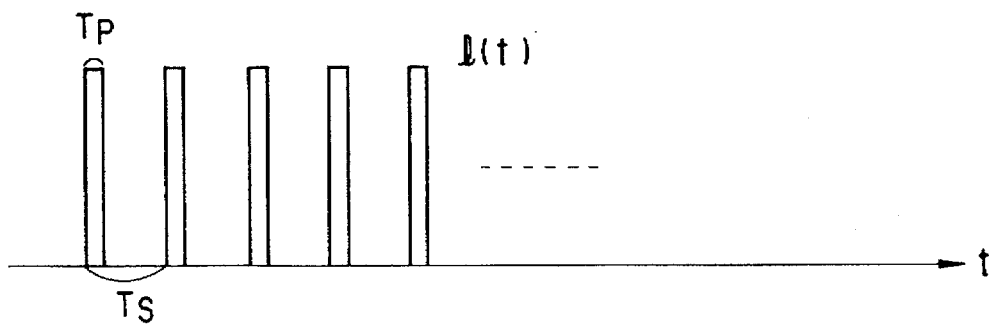
FIG. 13 is a diagram exemplifying the waveform in a time domain of a pulse train to be used as a sampling signal.
Figure 14:
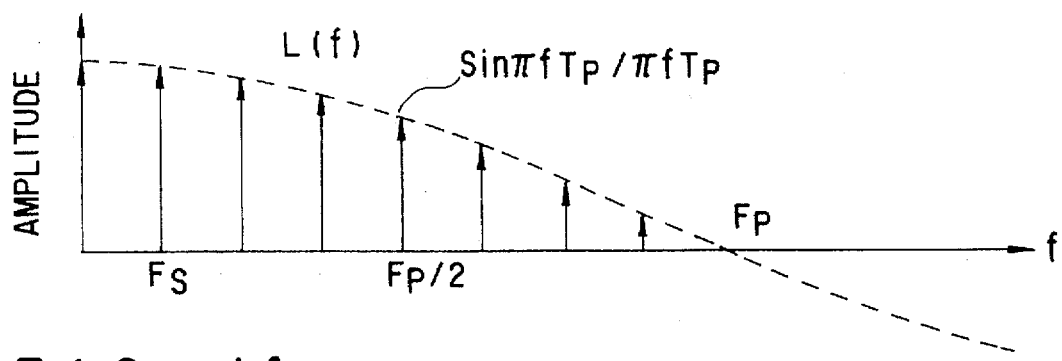
FIG. 14 is a diagram showing the frequency spectrum of the pulse train shown in FIG. 13.
Figure 15:
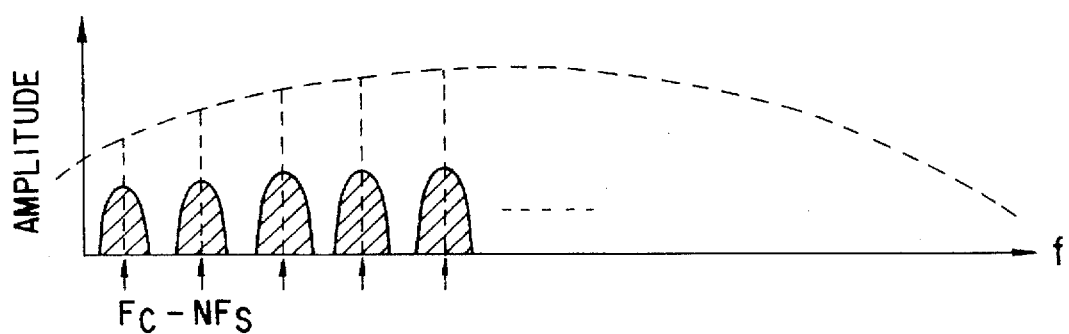
FIG. 15 is a diagram showing the frequency spectrum of an intermediate frequency signal obtained by sampling the input signal with the pulse train in FIG. 13.

If a pulse train having a pulse width $T_P$ as shown in FIG. 13 is used as the sampling signal, the amplitude has the shape of $\sin(\pi f T_P)/(\pi f T_P)$ as shown in FIG. 14 due to the pulse width $T_P$, so that the signal after frequency-conversion may considerably attenuate in the low frequency band as shown in FIG. 15. To prevent such attenuation, the pulse width should be reduced sufficiently like that of the impulse train SP1 discussed in the section of the first embodiment. It is however actually impossible to produce a pulse train having no pulse width at all. By setting the pulse width $T_P$ of the sampling pulse to the value that meets the condition expressed by the equation (7), it is possible to suppress the attenuation of the amplitude of the signal after frequency-conversion particularly in the low frequency band.

The above will be described more specifically. Suppose that the center frequency $F_C$ of the input signal to the sampling circuit 36 is 2000 MHz and the band width $F_B$ thereof is 20 MHz, i.e., the input signal is a band signal of 1990 MHz to 2010 MHz. The sampling frequency $F_S$ is set to 49.7 MHz as discussed in the section of the first embodiment. Accordingly, the 2010-MHz frequency component of the input signal is frequency-converted to have a frequency of 2010−(49.7×40)=22 MHz, the 2000-MHz frequency component is frequency-converted to have a frequency of 2000−(49.7×40)=12 MHz, and the 1990-MHz frequency component is frequency-converted to have a frequency of 1990−(49.7×40)=2 MHz. This is the same as described in the section of the first embodiment.

Assume that the pulse width $T_P$ of the sampling pulse train is set to 1 nsec or $F_P$=1 GHz. With $T_P$ denoting the pulse width of the pulse train, the frequency spectrum is the impulse train of $F_S$ (=1/$T_S$) multiplied by $\sin(\pi f T_P)/(\pi f T_P)$, so that the frequency spectrum actually becomes the impulse train of $F_S$ 49.7 MHz multiplied by $\sin(\pi f \cdot 1 \times 10^{-9})/(\pi f \cdot 1 \times 10^{-9})$. When the maximum level is set to "1," therefore, the relative value of the level of the 2-MHz signal obtained by frequency-converting the 1990-MHz signal becomes $$\sin(\pi \cdot 1990 \times 106 \cdot 1 \times 10^{-9})/(\pi \cdot 1990 \times 106 \cdot 1 \times 10^{-9}) = \quad (8)$$

$$5.03 \times 10^{-3}$$

Likewise, the relative values of the levels of the 12-MHz signal and 22-MHz signal become −7.47×10⁻⁷ and 5.04× 10⁻³, respectively. It is apparent that the output level of the signal after frequency-conversion may greatly reduce depending on the pulse width $T_P$ of the sampling pulse.

If the pulse width $T_P$ of the sampling pulse is set to the value that meets the condition expressed by the equation (7), however, it is possible to suppress the attenuation of the amplitude of the signal after frequency-conversion. The conditional equation of the equation (7) becomes $$2000/N2[\text{MHz}] < F_P < 1990/(N2-1)[\text{MHz}] \quad (9)$$

Suppose $$F_P = 4020/N3 \quad (10)$$

Given that N3=5, then $F_P$=804 MHz or $T_P$=1.244 nsec, and the relative value of the level of the signal obtained by frequency-converting the 1990-MHz signal becomes $$\sin(\pi \cdot 1990 \times 106 \cdot 1.244 \times 10^{-9})/(\pi \cdot 1990 \times 106 \cdot \quad (11)$$

$$1.244 \times 10^{-9}) = 0.128$$

Likewise, the relative values of the levels of the 12-MHZ signal and 22-MHz signal become 0.128 and 0.127. It is therefore possible to suppress the reduction in signal level after frequency-conversion as compared with the case where $T_P$ is set to 1×10⁻⁹.

According to this embodiment, as described above, the frequency conversion circuit which uses a pulse train having a pulse width as a sampling signal is provided with the pulse train generator 57 which generates the pulse train whose frequency $F_S$ is set to the value that satisfies the condition of the equation (1) and whose pulse width $T_P$ is set to the value that satisfies the condition of the equation (7). It is therefore possible to prevent superimposition from occurring in the spectra after frequency-conversion, and to suppress the attenuation of the signal level of the frequency-converted signal in the low frequency band to output the received intermediate frequency signal having a sufficiently large signal level in the low frequency band, regardless of the use of the pulse train having the pulse width $T_P$.

There will now be described a fourth embodiment hereinafter.

According to this embodiment, a portable digital cellular phone, which has a sampling type frequency conversion circuit and uses a pulse train having a pulse width as a sampling signal, is provided with a circuit for computing the optimal sampling frequency for frequency-conversion and variably setting the sampling frequency in a sampling signal generator and a circuit for computing the optimal pulse width and variably setting the pulse width in the sampling signal generator, whereby frequency-conversion is executed with the sampling pulse which has the optimal sampling frequency that does not cause superimposition for any of a plurality of radio systems of different usable frequency bands and has the optimal pulse width that can suppress the attenuation of the signal level.

Figure 16:
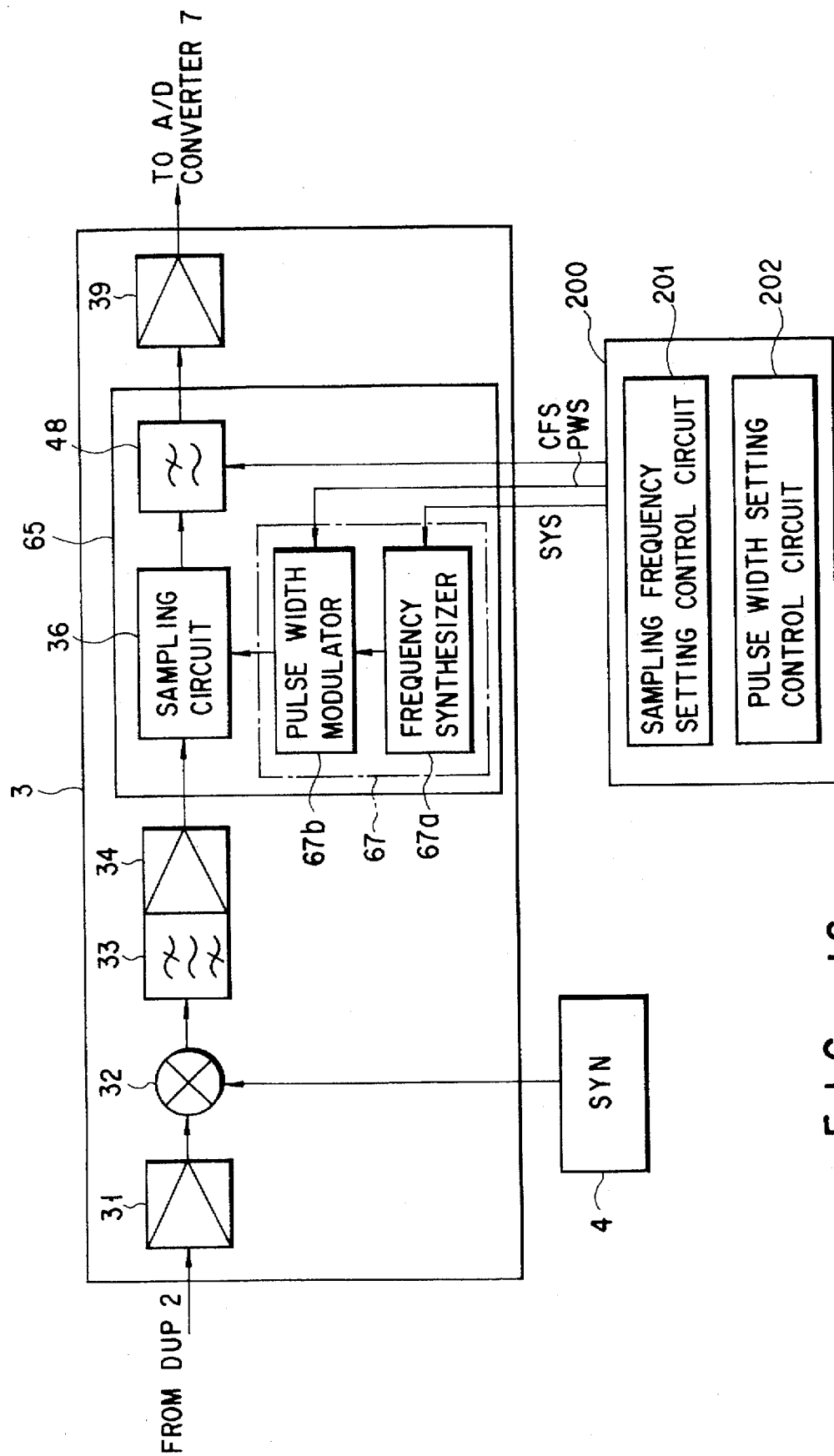
FIG. 16 is a circuit block diagram showing the structures of the essential portions of a portable digital cellular phone equipped with a frequency conversion circuit according to a fourth embodiment of this invention.

FIG. 16 presents a circuit block diagram showing the structures of the essential portions of a portable digital cellular phone equipped with a frequency conversion circuit according to this embodiment. Like or same reference numerals as used in FIG. 10 are also used in FIG. 16 to denote corresponding or identical components and their detailed descriptions will not be given.

The frequency conversion circuit 65 of this embodiment comprises a sampling circuit 36, a pulse train generator 67, and a low pass filter 48 constituted of an active filter whose cut-off frequency can be variably set externally. The pulse train generator 67 is constituted of a frequency synthesizer whose oscillation frequency can be variably set externally and a pulse width modulation circuit for variably setting the pulse width of a pulse train output from this frequency synthesizer. This pulse train generator 67 generates a pulse train SP4 of a frequency, which corresponds to the oscillation frequency control signal SYS supplied from a controller 20C and has a pulse width $T_P$ corresponding to a pulse width control signal PWS.

The controller 20C has a sampling frequency setting control circuit 201 and a pulse width setting control circuit 202 in addition to the ordinary control functions like the radio channel connection control and communications control. When the radio system at the communication destination is switched to another one, the control circuit 202 computes the optimal pulse width $T_P$ in accordance with the equation (7) based on the center frequency $F_C$ and band width $F_B$ of the frequency band the switched new radio system uses. The pulse width control signal PWS for designating the computed optimal pulse width $T_P$ is supplied to the pulse width modulation circuit of the pulse train generator 67. The function of the sampling frequency setting control circuit 201 is the same as that of the control circuit 201 of the second embodiment (FIG. 6).

With the above structure, when an instruction to switch the first digital communication system which one carrier uses to the second digital radio system of a different frequency band which another carrier uses, the controller 20C computes the optimal sampling frequency $F_{S2}$ and cut-off frequency $F_{cut2}$ in accordance with the sequence illustrated in FIG. 11 first, and then sets the computed optimal sampling frequency $F_{S2}$ and cut-off frequency $F_{cut2}$ in the frequency synthesizer in the pulse train generator 67 and the low pass filter 48, respectively.

Next, the controller 20C executes control to compute the pulse width $T_{P2}$ in accordance with the sequence illustrated in FIG. 17. First, N2 is arbitrarily set in step 13a, and $$\frac{F_C + F_B}{N2} \quad (12)$$

and $$\frac{F_C - F_B}{N2 - 1} \quad (13)$$

are computed in step 13d. In step 13e, the pulse width $T_{P2}$ (=1/$F_{P2}$) is obtained from $F_P$ and the pulse width control signal PWS for setting this pulse width $T_{P2}$ is supplied to the pulse width modulation circuit of the pulse train generator 67. Therefore, the pulse train generator 67 generates the pulse train SP4 of the sampling frequency $F_{S2}$ designated by the controller 20C and having the pulse width $T_{P2}$ thereafter. When communications start in this situation, therefore, the sampling circuit 36 samples the first received intermediate frequency signal with the impulse train SP4 having the frequency $F_{S2}$ and pulse width $T_{P2}$.

At this time, the frequency $F_{S2}$ of the pulse train SP4 is changed by the controller 20C in such a manner that a plurality of signals with different frequencies before frequency-conversion are not frequency-converted to have the same frequency. Even when radio communications are to be performed with the second digital radio system, therefore, the accurate frequency-conversion can be executed over the entire usable frequency band without causing the superimposition of a plurality of channel signals.

Because the cut-off frequency $F_{cut2}$ of the low pass filter 48 is set to the optimal value, it is possible to accurately extract the spectrum with the lowest frequency from a plurality of spectra appearing on the output of the sampling circuit 36, thereby allowing the received intermediate frequency signal having as low a frequency as possible to be supplied to the digital signal processor at the subsequent stage.

Further, the pulse width $T_{P2}$ is also changed by the controller 20C to the value that prevents the signal level after frequency-conversion from significantly attenuating in the low frequency band. Even when a radio signal coming from the second digital radio system is to be received, therefore, it is possible to output the received intermediate frequency signal with a sufficiently large signal level in the low frequency band without causing significant attenuation of the signal level of the frequency-converted signal in the low frequency band.

There will now be described a fifth embodiment hereinafter.

It is understood that by using the sampling frequency $F_S$ that satisfies the condition depicted in the section of the first embodiment (FIG. 6), the input signal can be frequency-converted to have a frequency in the vicinity of the base band without superimposition of the desired signal on another signal. According to the fifth embodiment, when the band signal in the input signal consists of a plurality of narrow band signals, signals in a desired arbitrary channel are always converted to have the same intermediate frequency lower than that of the desired arbitrary channel. This embodiment is adapted for the frequency-conversion of a system which comprises 77 narrow band signals or so-called "channels" in the band of 23.1 MHz like PHS.

In executing demodulation with such a system, it is desirable that the intermediate frequency after frequency-conversion be the same for the purpose of easily constituting the subsequent-stage circuit by a frequency converter.

In this embodiment, the received signal can always be converted to have the same intermediate frequency by setting the sampling frequency $F_S$ as follows. The value of N1 in the equation (1) should be selected to be an integer that meets the following condition.

$$N1 < \left[\frac{F_C + F_B}{2F_B}\right] - \left(\frac{3 + F_C/F_B}{4}\right) \quad (14)$$

The use of N1 that meets this condition allows the intermediate frequency $F_{IF}$ to always be $2F_B$ by changing the sampling frequency $F_S$ in accordance with the channel to be demodulated. [ ] indicates a gauss symbol and represents the maximum integer which does not exceed the number inside the symbol.

Given that the center frequency of the desired channel is $F_n$, the sampling frequency $F_S$ is determined from the following equations.

When $[F_C+F_B/2F_B]-N1$ is an odd number, $$F_S = \frac{F_n - 2F_B}{\{[F_C + F_B/2F_B] - (N1+1)\}/2} \quad (15)$$

When $[F_C+F_B/2F_B]-N1$ is an even number, $$F_S = \frac{F_n + 2F_B}{\{[F_C + F_B/2F_B] - (N1)\}/2} \quad (16)$$

This will be explained with reference to a specific example.

Assume that the center frequency $F_C$ of the input signal is 2000 MHz and band width $2F_B$ is 20 MHz. That is, the input signal is a band signal ranging from 1990 MHz to 2010 MHz. It is also assumed that there are 40 channels at intervals of 500 kHz in this band. That is, the first channel is 1990.25 MHz, the second channel is 1990.75 MHz and so forth, and the last, 40th channel is 2009.075 MHz. In this case, N1 that meets the following condition should be selected from the equations (15) and (16) in order to always ensure the frequency-conversion to the same intermediate frequency.

$$N1 > 100 - \frac{3 + 200}{4} = \frac{197}{4} = 49.25$$

When N1=51 and the intermediate frequency $F_{IF}$=20 MHz, for example, $[F_C+F_B/2F_B]-N1$ is an odd number, so that the sampling frequency $F_S$ for the desired signal of the first channel or 1990.25 MHz should be (1990.25−20)/{100−(51+1)}/2=82.09375 MHz. For the second channel or 1990.75 MHz, the sampling frequency $F_S$ should be (1990.75−20)/{100−(51+1)}/2=82.1146 MHz. For the 40th channel or 2009.75 MHz, the sampling frequency $F_S$ should be (2009.75−20)/{100−(51+1)}/2=82.9063 MHz.

When N1=50 and the intermediate frequency $F_{IF}$=20 MHz, for example, $[F_C+F_B/2F_B]-N1$ is an even number, so that the sampling frequency $F_S$ for the desired signal of the first channel or 1990.25 MHz should be (1990.25+20)/(100−50)/2=80.41 MHz. For the second channel or 1990.75 MHz, the sampling frequency $F_S$ should be (1990.75+20)/(100−50)/2=80.43 MHz. For the 40th channel or 2009.75 MHz, the sampling frequency $F_S$ should be (2009.75+20)/(100−50)/2=81.19 MHz.

All of the above frequencies satisfy the equation (1) in the first embodiment.

When N1=51 in the equation (1), the range of the sampling frequency $F_S$ is as follows.

$$\frac{4020}{100-51} \text{ [MHz]} < F_S < \frac{3980}{100-52} \text{ [MHz]}$$

or $$82.04 \text{ [MHz]} < F_S < 82.92 \text{ [MHz]}.$$

When N1=50 in the equation (1), the range of the sampling frequency $F_S$ is as follows.

$$\frac{4020}{100-50} \text{ [MHz]} < F_S < \frac{3980}{100-51} \text{ [MHz]}$$

or $$80.4 \text{ [MHz]} < F_S < 81.22 \text{ [MHz]}.$$

The following describes the case of PHS. For the PHS, the center frequency $F_C$=1906.55 MHz and the band width $2F_B$=23.1 MHz. That is, the input signal is a band signal ranging from 1895.0 MHz to 1918.1 MHz. There are 77 channels at intervals of 300 kHz in this band. That is, the first channel is 1895.15 MHz, the second channel is 1895.45 MHz and so forth, and the last, 77th channel is 1917.95 MHz. In this case, N1 that meets the following condition should be selected from the above equations in order to always ensure the frequency-conversion to the same intermediate frequency.

$$N1 > 83 - \frac{3 + 165.07}{4} = 40.98$$

When N1=42 and the intermediate frequency $F_{IF}$=23.1 MHz, for example, $[F_C+F_B/2F_B]-N1$ is an odd number, so that the sampling frequency $F_S$ for the desired signal of the first channel or 1895.15 MHz should be (1895.15−23.1)/{83−(42+1)}/2=93.6025 MHz. For the second channel or 1895.45 MHz, the sampling frequency $F_S$ should be (1895.45−23.1)/{83−(42+1)}/2=93.6175 MHz. For the 77th channel or 1917.95 MHz, the sampling frequency $F_S$ should be (1917.95−23.1)/{83−(42+1)}/2=94.4725 MHz.

When N1=41 and the intermediate frequency $F_{IF}$=20 MHz, for example, $[F_C+F_B/2F_B]-N1$ is an even number, so that the sampling frequency $F_S$ for the desired signal of the first channel or 1895.15 MHz should be (1895.15+23.1)/(83−41)/2=91.34524 MHz. For the second channel or 1895.45 MHz, the sampling frequency $F_S$ should be (1895.45+23.1)/(83−41)/2=91.35952 MHz. For the 77th channel or 1917.95 MHz, the sampling frequency $F_S$ should be (1917.95+23.1)/(83−41)/2=92.43095 MHz.

According to this embodiment, as described above, an arbitrary signal in a plurality of band signals in a given band can always be converted to have the same intermediate frequency, thus contributing to the significant simplification of the circuit at the subsequent stage of the frequency converter.

A description will now be given of the sixth embodiment which is the first embodiment adapted for use in a radio communication apparatus.

Figure 18:
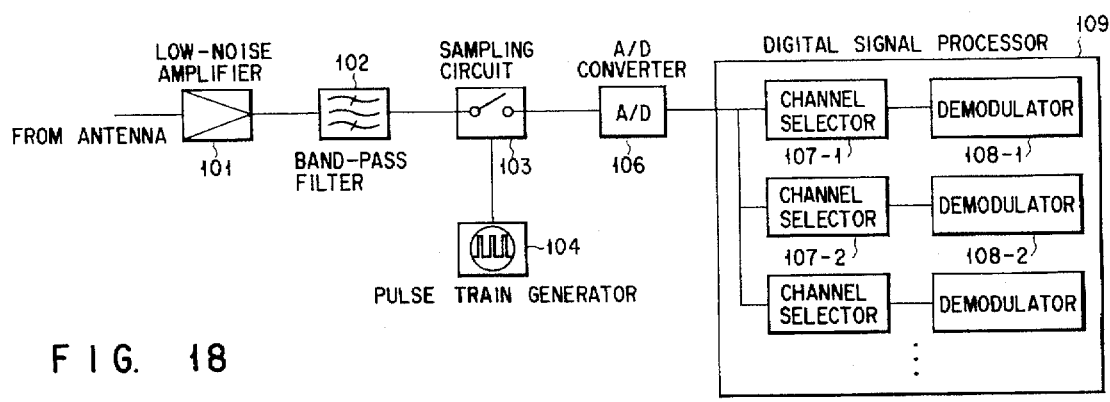
FIG. 18 is a block diagram of a radio communication apparatus using the frequency conversion circuit of the first embodiment.

As shown in FIG. 18, the received signal coming from the antenna is amplified to the desired level by a low-noise amplifier 101. The amplified signal is input to a band-pass filter 102 to be band-limited. The band-limited output signal of the band-pass filter 102 is sampled by a sampling circuit 103 of the type used in the first embodiment. The sampling pulse is produced from a pulse train generator 104, and its frequency satisfies the condition mentioned in the section of the first embodiment. The signal sampled by the sampling circuit 103 is input to an A/D converter 106.

Through the above operation, the analog input signal is converted to a digital signal. This digital signal undergoes channel selection to be demodulated by a digital signal processor 109. The digital signal after the A/D conversion may include a plurality of channels. It is possible to easily demodulate a plurality of channels at a time by selecting a plurality of channels and performing the demodulation in the digital signal processor.

A description will now be given of the seventh embodiment which is the fifth embodiment adapted for use in a radio communication apparatus.

Figure 19:
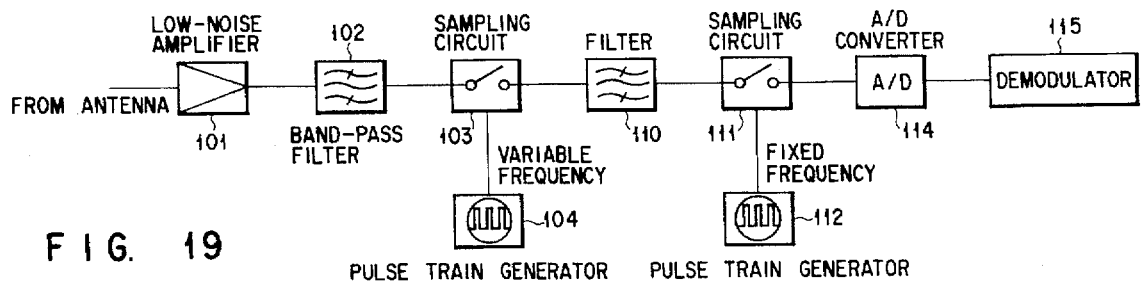
FIG. 19 is a block diagram of a radio communication apparatus using the frequency conversion circuit according to a fifth embodiment.

As shown in FIG. 19, the received signal coming from the antenna is amplified to the desired level by a low-noise amplifier 101. The amplified signal is input to a band-pass filter 102 to be band-limited.

The band-limited output signal of the band-pass filter 102 is sampled by a sampling circuit 103 of the type used in the first embodiment. The sampling pulse is produced from a pulse train generator 104, and its frequency satisfies the condition mentioned in the section of the fifth embodiment.

The signal sampled by the sampling circuit 103 is always frequency-converted to have a certain intermediate frequency as discussed in the section of the fifth embodiment. The sampled intermediate frequency signal is input to a band-pass filter 110. This filter 110 serves to prevent the signal obtained by the sampling by a second sampling circuit 111 at the subsequent stage from superimposing on the intermediate frequency signal. The characteristic of the filter 110 is determined by the fixed sampling frequency of a second pulse train generator 112 then. In the sampling at the second stage, the second pulse train generator 112 which generates the sampling frequency may be of a type which oscillates with a fixed frequency. The output signal from the sampling circuit 111 is converted to a digital signal by an A/D converter 114 and input to a demodulator 115.

Figures 20, 21:
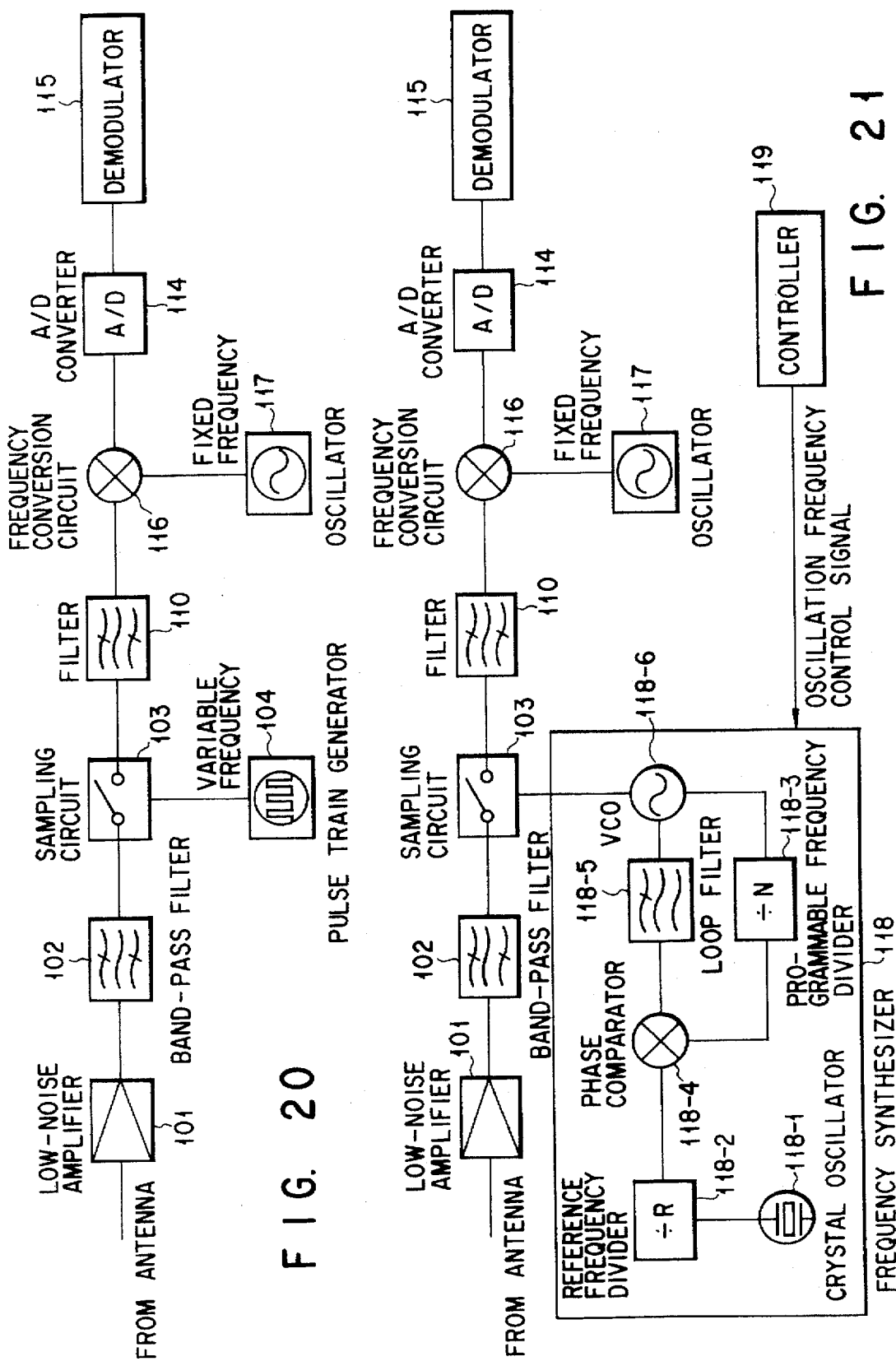
FIG. 20 is a block diagram of a radio communication apparatus using a frequency conversion circuit which uses an ordinary frequency converter and oscillator in place of a sampling circuit and a pulse train generator shown in FIG. 19.
FIG. 21 is a block diagram of a radio communication apparatus using a frequency conversion circuit which can vary the output frequency of the pulse train generator shown in FIG. 19.

The second-stage sampling circuit 111 and the pulse train generator 112 shown in FIG. 19 may be replaced with an ordinary frequency conversion circuit 116 and oscillator 117 as shown in FIG. 20. The output frequency of the oscillator 117 in this case can be relatively low and fixed, thus eliminating the need for a complicated circuit for the oscillator.

The pulse train generator 104 at the first stage in FIG. 19 should have a variable output frequency to set the constant intermediate frequency irrespective of the desired channel. FIG. 21 shows a specific way of accomplishing this means. A frequency synthesizer 118 is used for the first-stage pulse train generator in this modification. The frequency synthesizer 118, which employs the ordinary PLL, comprises a crystal oscillator 118-1 for generating a reference signal, a reference frequency divider 118-2 for frequency-dividing the output of the oscillator 118-1, a variable frequency divider 118-3 for frequency-dividing the frequency of a VCO (voltage-Controlled Oscillator) 118-6, a phase comparator 118-4 for comparing the phase of the reference signal with that of a comparison signal, a loop filter 118-5 for smoothing the output voltage of the phase comparator 118-4, and the VCO 118-6. The oscillation frequency is determined by setting the division numbers of the reference frequency divider 118-2 and the programmable frequency divider 118-3 in accordance with the oscillation frequency control signal from a controller 119.

According to the present invention as described above, there can be provided a radio communication equipment provided with a frequency conversion circuit capable of outputting an intermediate frequency signal whose signal component within a low frequency band signal has a sufficient high level, without superimposing the signals from a plurality of radio systems of different frequencies on one another.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A frequency conversion apparatus comprising:

a sampling circuit for receiving an input signal having a predetermined intermediate frequency and a predetermined band width and sampling the input signal in accordance with a predetermined sampling frequency signal, to output an intermediate frequency signal; and sampling signal generating means for outputting the sampling frequency signal to the sampling circuit, the sampling frequency signal having a frequency determined so that an integer multiple of not less than three times the sampling frequency is outside a frequency range of the input signal.

2. A frequency conversion apparatus according to claim 1, wherein said sampling signal generating means comprises a sampling signal generator for generating a pulse train signal as the sampling frequency signal, the pulse train signal having a frequency $F_S$ previously set to an arbitrary value within a range indicated by $$\frac{2(F_C+F_B)}{\left[\frac{F_C+F_B}{2F_B}\right]-N1} < F_S < \frac{2(F_C-F_B)}{\left[\frac{F_C+F_B}{2F_B}\right]-(N1+1)}$$

where $$N1 = 0, 1, 2, \ldots, \left[\frac{F_C+F_B}{2F_B}\right] - 2;$$

and $F_C$: a center frequency of the input signal $F_B$: a band width of the input signal.

3. The frequency conversion apparatus according to claim 2, wherein said sampling signal generating means comprises a control signal generator for generating a control signal having a frequency corresponding to that of the pulse train signal, and a frequency synthesizer for generating a pulse train signal having an oscillation frequency determined by the control signal from said control signal generator.

4. The frequency conversion apparatus according to claim 3, wherein said sampling signal generating means includes means for setting a pulse width of the pulse train signal at a predetermined value.

5. The frequency conversion apparatus according to claim 2, wherein said sampling signal generating means generates a pulse train signal having a pulse width whose inverse number $F_P$ is previously set to an arbitrary value within a range indicated by $$\frac{F_C+F_B}{N2} < F_P < \frac{F_C-F_B}{N2-1}$$

where N2=2, 3, 4, . . . .

6. The frequency conversion apparatus according to claim 5, wherein said sampling signal generating means comprises a control signal generator for generating a control signal having a frequency corresponding to that of the pulse train signal, and a frequency synthesizer for generating a pulse train signal having an oscillation frequency determined by the control signal from said control signal generator.

7. The frequency conversion apparatus according to claim 6, wherein said sampling signal generating means includes means for setting a pulse width of the pulse train signal at a predetermined value.

8. The frequency conversion apparatus according to claim 1, wherein said sampling signal generating means comprises a sampling signal generator for generating the sampling frequency signal having a frequency $F_S$ less than one-half of a center frequency $F_C$ of the input signal and satisfying the following condition:

$n \cdot F_S \leq F_C - F_B$
$F_C + F_B \leq (n+1) \cdot F_S$
$F_B$: a band width of the input signal.

9. A radio communication equipment comprising:

a first frequency conversion circuit for receiving a reception signal sent from one of a plurality of radio equipments of different frequency bands and converting the reception signal to a first intermediate frequency signal having a frequency lower than that of the reception signal;

a second frequency conversion circuit including a sampling circuit for sampling the first intermediate frequency signal in accordance with a predetermined sampling frequency signal to output a second intermediate frequency signal, and a sampling signal generator for outputting the sampling frequency signal to the sampling circuit, the sampling frequency signal having a frequency determined so that an integer multiple of not less than three times the sampling frequency is outside a frequency range of the first intermediate frequency; and demodulating means for demodulating the second intermediate frequency signal.

10. The radio communication equipment according to claim 9, wherein said sampling signal generating means comprises a sampling signal generator for generating a pulse train signal as the sampling frequency signal, the pulse train signal having a frequency $F_S$ previously set to an arbitrary value within a range indicated by $$\frac{2(F_C + F_B)}{\left[\frac{F_C + F_B}{2F_B}\right] - N1} < F_S < \frac{2(F_C - F_B)}{\left[\frac{F_C + F_B}{2F_B}\right] - (N1 + 1)}$$

where $$N1 = 0, 1, 2, \ldots, \left[\frac{F_C + F_B}{2F_B}\right] - 2;$$

and $F_C$: a center frequency of the first intermediate frequency signal $F_B$: a band width of the first intermediate frequency signal.

11. The radio communication equipment according to claim 10, wherein said sampling signal generating means comprises a control signal generator for generating a control signal having a frequency corresponding to that of the pulse train signal, and a frequency synthesizer for generating a pulse train signal having an oscillation frequency determined by the control signal from said control signal generator.

12. The radio communication equipment according to claim 11, wherein said sampling signal generating means includes means for setting a pulse width of the pulse train signal at a predetermined value.

13. The radio communication equipment according to claim 10, wherein said sampling signal generating means generates a pulse train signal having a pulse width whose inverse number $F_P$ is previously set to an arbitrary value within a range indicated by $$\frac{F_C + F_B}{N2} < F_P < \frac{F_C - F_B}{N2 - 1}$$

where $N2 = 2, 3, 4, \ldots$

14. The radio communication equipment according to claim 13, wherein said sampling signal generating means comprises a control signal generator for generating a control signal having a frequency corresponding to that of the pulse train signal, and a frequency synthesizer for generating a pulse train signal having an oscillation frequency determined by the control signal from said control signal generator.

15. The radio communication equipment according to claim 14, wherein said sampling signal generating means includes means for setting a pulse width of the pulse train signal at a predetermined value.

16. A radio communication equipment comprising:

a filter for band-limiting received signals of different frequency bands;

a frequency conversion circuit including a sampling circuit for sampling the received signal band-limited by said filter, in accordance with a predetermined sampling frequency signal to output an intermediate frequency signal, and a sampling signal generator for outputting the sampling frequency signal to said sampling circuit, the sampling frequency signal having a frequency determined so that an integer multiple of not less than three times the sampling frequency is outside a frequency range of the received signal; and demodulating means for demodulating the intermediate frequency signal.

17. A radio communication equipment comprising:

a first frequency conversion circuit which includes a first sampling circuit for receiving one of a plurality of reception signals of different frequency bands and sampling the one of the reception signals in accordance with a first sampling frequency signal to output a first intermediate frequency signal, and a first sampling signal generator for supplying the first sampling frequency signal to said first sampling circuit, the sampling frequency signal having a frequency determined so that an integer multiple of not less than three times the sampling frequency is outside a frequency range of the first intermediate frequency signal;

a second frequency conversion circuit including a second sampling circuit for sampling the first intermediate frequency signal in accordance with a second sampling frequency signal to output a second intermediate frequency signal, and a second sampling signal generator for outputting the second sampling frequency signal to said sampling circuit, the second sampling frequency signal having a frequency determined so that an integer multiple of not less than three times the second sampling frequency signal is outside a frequency range of the first intermediate frequency signal; and demodulating means for demodulating the second intermediate frequency signal.

18. A radio communication equipment comprising:
a first frequency conversion circuit which includes a sampling circuit for receiving one of a plurality of reception signals of different frequency bands and sampling the one of the reception signals in accordance with a sampling frequency signal to output a first intermediate frequency signal, and a sampling signal generator for supplying the sampling frequency signal to said sampling circuit, the sampling frequency signal having a frequency determined so that an integer multiple of not less than three times the sampling frequency is outside a frequency range of the first intermediate frequency signal;

a second frequency conversion circuit for frequency-converting the first intermediate frequency signal in accordance with a predetermined frequency signal to output a second intermediate frequency signal; and demodulating means for demodulating the second intermediate frequency signal.

19. The radio communication apparatus according to claim 18, wherein said sampling signal generator comprises a frequency synthesizer for changing the sampling frequency in order to hold the first intermediate frequency at a constant value inserted of the frequency of the reception signal.

* * * * *